(12) United States Patent
Ochi

(10) Patent No.: US 8,039,941 B2
(45) Date of Patent: Oct. 18, 2011

(54) CIRCUIT BOARD, LEAD FRAME, SEMICONDUCTOR DEVICE, AND METHOD FOR FABRICATING THE SAME

(75) Inventor: Takao Ochi, Shiga (JP)

(73) Assignee: Panasonic Corporation, Osaka (JP)

( * ) Notice: Subject to any disclaimer, the term of this patent is extended or adjusted under 35 U.S.C. 154(b) by 242 days.

(21) Appl. No.: 12/423,532

(22) Filed: Apr. 14, 2009

(65) Prior Publication Data

US 2009/0289347 A1 Nov. 26, 2009

(30) Foreign Application Priority Data

May 26, 2008 (JP) ................................. 2008-137093
Feb. 4, 2009 (JP) ................................. 2009-023474

(51) Int. Cl.
*H01L 23/06* (2006.01)

(52) U.S. Cl. .......................... 257/684; 257/676; 257/692

(58) Field of Classification Search .................... 257/684
See application file for complete search history.

(56) References Cited

U.S. PATENT DOCUMENTS

| | | | |
|---|---|---|---|
| 5,075,758 A | 12/1991 | Aizawa | |
| 5,245,216 A | 9/1993 | Sako | |
| 2001/0002065 A1 | 5/2001 | Drehobl et al. | |
| 2002/0180022 A1* | 12/2002 | Emoto | 257/686 |
| 2005/0156305 A1 | 7/2005 | Moriguchi et al. | |

FOREIGN PATENT DOCUMENTS

JP 2000-227439 8/2000

* cited by examiner

*Primary Examiner* — Thien F Tran
(74) *Attorney, Agent, or Firm* — McDermott Will & Emery LLP

(57) ABSTRACT

A semiconductor device includes: an element mounting member including a first electrode; a semiconductor element mounted on the element mounting member and including a second electrode; and an interposer element mounted on the element mounting member with a first side of the interposer element facing one of a side of the semiconductor element. The interposer element is one of a triangle and a trapezoid in plan view, and includes: a first interposer electrode electrically connected to the second electrode via a first wire; a second interposer electrode electrically connected to the first electrode; and an internal interconnection electrically connecting the first interposer electrode and the second interposer electrode to each other.

5 Claims, 12 Drawing Sheets

CIRCUIT BOARD, LEAD FRAME, SEMICONDUCTOR DEVICE, AND METHOD FOR FABRICATING THE SAME

CROSS-REFERENCE TO RELATED APPLICATIONS

This application claims priority from Japanese Patent Applications Nos. JP2008-137093 filed on May 26, 2008 and JP2009-023474 filed on Feb. 4, 2009, each of which is hereby incorporated by reference in its entirety for all purposes.

BACKGROUND

The present disclosure relates generally to circuit boards, lead frames, semiconductor devices, and methods for fabricating these components and, in particular, to a fine-pitch multi-terminal semiconductor device and a method for fabricating the same.

With miniaturization of semiconductor elements and increase in the number of terminals, the electrode pitch has become finer and finer. However, the electrode pitch of a board on which a semiconductor element is mounted cannot be reduced to the same degree as the reduction in the electrode pitch of the semiconductor element. Accordingly, it is necessary to increase the length of wires drawn from the semiconductor element in order to catch up with the reduction in the electrode pitch.

In addition, semiconductor devices are required of further miniaturization and cost reduction, and thus the electrode pitch of semiconductor elements tends to be further reduced. However, increase in the length of wires drawn from the semiconductor elements could promote wire sweep during injection of molding resin, thus possibly causing a short-circuit between adjacent wires. Therefore, increase in the wire length for catching up with the reduction of pitch has a limitation.

On the other hand, a method in which a sensor chip is mounted on a circuit chip as described below is known (see, for example, Japanese Laid-Open Patent Publication No. 2000-227439). In this method, a circuit chip on which electrodes are arranged around a chip mounting region is prepared. A sensor chip is then mounted on the chip mounting region, and electrodes of the sensor chip and the electrodes of the circuit chip are connected to each other by wire bonding. The electrodes around the chip mounting region are connected to electrodes provided on the outer periphery of the circuit chip which are connected to a package by wires.

Application of this method may lead to reduction in the length of wires drawn from a semiconductor element. Specifically, an interposer element including first electrodes provided around a mounting region for a semiconductor element and second electrodes provided on its outer periphery is prepared. In the interposer element, the first electrodes are respectively connected to associated ones of the second electrodes. The first electrodes of the interposer element are connected to electrodes of the semiconductor element mounted on the mounting region of the interposer element. The second electrodes of the interposer element are connected to electrodes of a circuit board. This structure is expected to reduce the wire length even in a case where a finer-pitch semiconductor element is mounted on a circuit board. In addition, it is also expected that such short wires reduce the wire diameter and, accordingly, the pad size. As a result, not only miniaturization but also cost reduction is expected.

SUMMARY

The conventional method in which a sensor chip is mounted on a circuit chip, however, has the following drawbacks: First, since an interposer element and a semiconductor element stacked on the interposer element are mounted on a circuit board, a large number of processes are needed, and hence fabrication cost increases. Further, the thickness of a package also increases. In addition, the size of the interposer element is larger than that of the semiconductor element because the semiconductor element needs to be mounted on the interposer element. Such a large interposer element would increase the cost. Moreover, if the semiconductor element has a very high wire density, molding resin is less likely to reach portions under wires, causing incomplete filling with resin, wire sweep, wire proximity, and wire sag.

It is therefore an object of the present disclosure to provide a semiconductor device incorporating a fine-pitch semiconductor element without a technique for stacking a semiconductor element or the like.

To achieve the object, an example semiconductor device has a configuration in which a semiconductor element and an interposer element are mounted on a circuit board with a side of the semiconductor element facing a side of the interposer element.

Specifically, a first example semiconductor device of this disclosure includes: an element mounting member including a first electrode; a semiconductor element mounted on the element mounting member and including a second electrode; and an interposer element mounted on the element mounting member with a first side of the interposer element facing a side of the semiconductor element, the interposer element being one of a triangle and a trapezoid in plan view and including a first interposer electrode electrically connected to the second electrode via a first wire, a second interposer electrode electrically connected to the first electrode, and an internal interconnection electrically connecting the first interposer electrode and the second interposer electrode to each other.

In the first example semiconductor device, when the electrode of the semiconductor element and the first interposer electrode are connected to each other and the second interposer electrode and the electrode of the element mounting member are connected to each other, the length of wires drawn from the semiconductor element can be greatly reduced. In addition, the interposer element is mounted on the element mounting member with a side of the interposer element facing a side of the semiconductor element. Accordingly, the thickness of the semiconductor device can be reduced. Further, an insulating resin layer may be formed between the semiconductor element and the interposer element. Then, even when wires are highly densely arranged, it is possible to suppress failures such as wire sweep, wire proximity, and wire sag caused by incomplete resin molding. Moreover, since the interposer element is a triangle or a trapezoid in plan view, the interposer element can be placed effectively. Accordingly, the semiconductor device can be miniaturized.

A second example semiconductor device of this disclosure includes: an element mounting member including a first electrode and having a first region in the shape of a quadrilateral in plan view and a second region in the shape of a quadrilateral in plan view larger than the first region; a semiconductor element mounted on the first region and including a second electrode; and a plurality of interposer elements mounted on the element mounting member with a first side of each of the interposer elements facing a side of the semiconductor element, each of the interposer elements including a first interposer electrode electrically connected to the second electrode via a first wire, a second interposer electrode electrically connected to the first electrode, and an internal interconnection electrically connecting the first interposer electrode and the second interposer electrode to each other. Each of the interposer elements is placed in such a manner that the first side at least partially overlaps a side of the quadrilateral of the first region and a second side of each of the interposer elements overlaps a side of the quadrilateral of the second region.

In the second example semiconductor device, when the electrode of the semiconductor element and the first interposer electrode are connected to each other and the second interposer electrode and the electrode of the element mounting member are connected to each other, the length of wires drawn from the semiconductor element can be greatly reduced. In addition, the interposer element is provided in such a manner that the first side of the interposer element at least partially overlaps a side of the quadrilateral of the first region and the second side of the interposer element overlaps a side of the quadrilateral of the second region. Accordingly, the interposer element can be mounted without wasting space, resulting in reduction of the size of the interposer element and the product size.

A method for fabricating a semiconductor device according to this disclosure includes the steps of: (a) preparing an element mounting member including a first electrode, a semiconductor element including a second electrode, and an interposer element including a first interposer electrode and a second interposer electrode electrically connected to each other via an internal interconnection; (b) mounting, on the element mounting member, the semiconductor element and the interposer element in such a manner that the semiconductor element and the interposer element are spaced apart from each other with a first side of the interposer element facing a side of the semiconductor element; (c) connecting the first electrode and the first interposer electrode to each other by a wire; and (d) connecting the second electrode and the second interposer electrode to each other. In step (a), the interposer element is one of a triangle and a trapezoid in plan view.

As described above, the method includes the steps of (b) mounting, on the element mounting member, the semiconductor element and the interposer element in such a manner that the semiconductor element and the interposer element are spaced apart from each other with a side of the interposer element facing a side of the semiconductor element; (c) connecting the first electrode and the first interposer electrode to each other by a wire; and (d) connecting the second electrode and the second interposer electrode to each other. Accordingly, the length of wires drawn from the semiconductor element can be greatly reduced.

BRIEF DESCRIPTION OF THE DRAWINGS

FIG. 1A is a plan view, and FIG. 1B is a cross-sectional view taken along line Ib-Ib in FIG. 1A.

FIG. 12A is a plan view, and FIG. 12B is a cross-sectional view taken along line XIIb-XIIb in FIG. 12A.

DETAILED DESCRIPTION

Embodiment

Figure 1A:
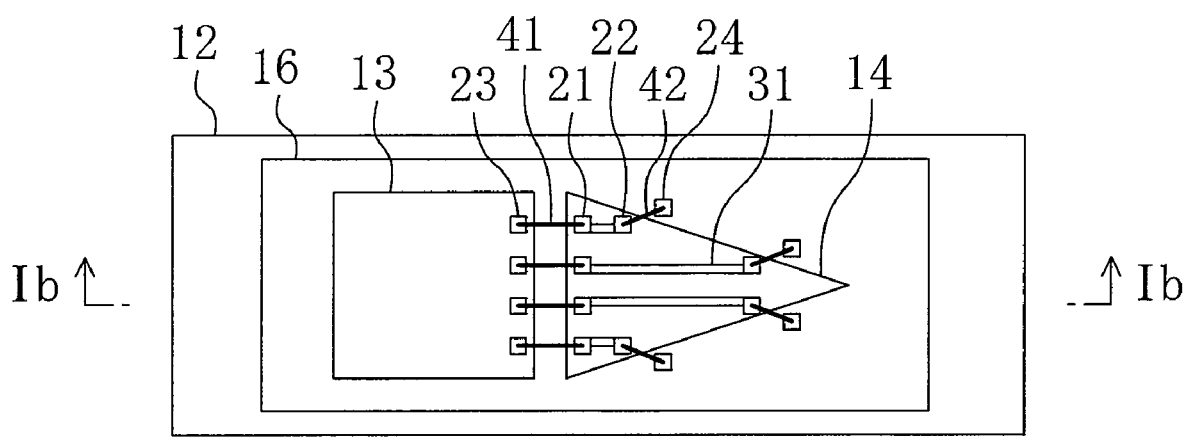
FIGS. 1A and 1B illustrate a semiconductor device according to an embodiment of the present invention.
Figure 1B:
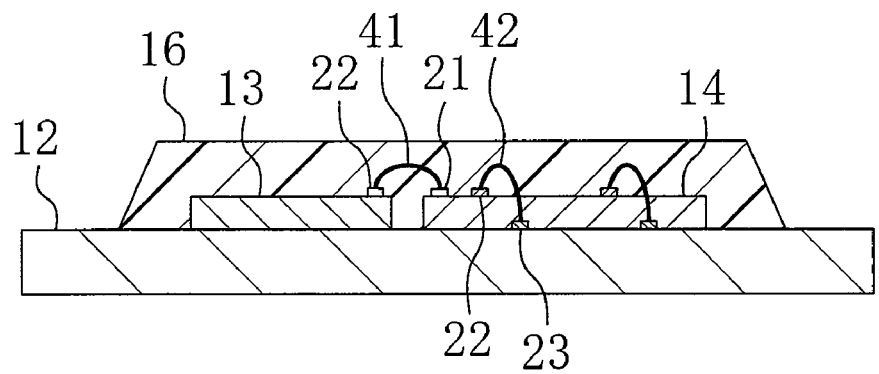

An embodiment of the present invention will be described with reference to the drawings. FIGS. 1A and 1B illustrate a semiconductor device according to this embodiment. FIG. 1A is a plan view, and FIG. 1B is a cross-sectional view taken along line Ib-Ib in FIG. 1A. In the drawings, portions actually hidden by molding resin are shown.

As illustrated in FIGS. 1A and 1B, in the semiconductor device of this embodiment, a semiconductor element 13 and an interposer element 14 are mounted on a circuit board 12 as an element mounting member, and these components are encapsulated with a molding resin 16. The interposer element 14 includes first interposer electrodes 21 and second interposer electrodes 22. The first interposer electrodes 21 are electrically connected to the second interposer electrodes 22 via internal interconnections 31.

In FIGS. 1A and 1B, the interposer element 14 is an isosceles triangle in plan view, and the first interposer electrodes 21 are arranged along the base of the triangle. The semiconductor element 13 is a quadrilateral such as a square or a rectangle in plan view, and element electrodes 23 are arranged along a side of the quadrilateral. The semiconductor element 13 and the interposer element 14 are spaced apart from each other in such a manner that the side of the semiconductor element 13 along which the element electrodes 23 are arranged and the base of the interposer element 14 along which the first interposer electrodes 21 are arranged face each other. The element electrodes 23 are electrically connected to the first interposer electrodes 21 by first wires 41. The second interposer electrodes 22 are electrically connected, by second wires 42, to board electrodes 24 provided on the upper surface of the circuit board 12.

Since the element electrodes 23 are connected to the board electrodes 24 via the interposer element 14, the wire length is much smaller than that in the case of directly connecting the element electrodes 23 to the board electrodes 24 by wires. Accordingly, it is possible to reduce the wire diameter, resulting in a smaller electrode size and, accordingly, a finer electrode pitch.

In the semiconductor device of this embodiment, the semiconductor element 13 is not mounted on the interposer element 14. This eliminates the necessity for a relatively-advanced technique of mounting a semiconductor element, and a normal die-bonding or wire-bonding technique can be employed. In addition, the height of wires can be reduced, as compared to the case of multilevel wire interconnection or the case of stacking the semiconductor element and the interposer element. Accordingly, the thickness of a package can be reduced. Moreover, the primary circuit of the semiconductor device requiring an advanced process is separated from electrodes, wires, and peripheral circuits for connection to external electrodes, and is combined with an interposer element fabricated with an inexpensive process. Then, it is possible to achieve a miniaturization process for high density, increase in the number of terminals, and minimization of the device size, together with cost reduction.

The planar shape of the interposer element 14 is not specifically limited, but is preferably an isosceles triangle, as illustrated in FIG. 1A. In such a case, the second interposer electrodes 22 and the board electrodes 24 are evenly arranged, thus suppressing wire sweep and reducing the size of the semiconductor device. In this case, when the first interposer electrodes 21 are arranged along the base of the isosceles triangle, the length of the first wires 41 can be reduced. The second interposer electrodes 22 may be arranged as sparsely as possible along an oblique side of the interposer element 14. Then, the distance between the board electrodes 24 can be increased.

Figure 2:
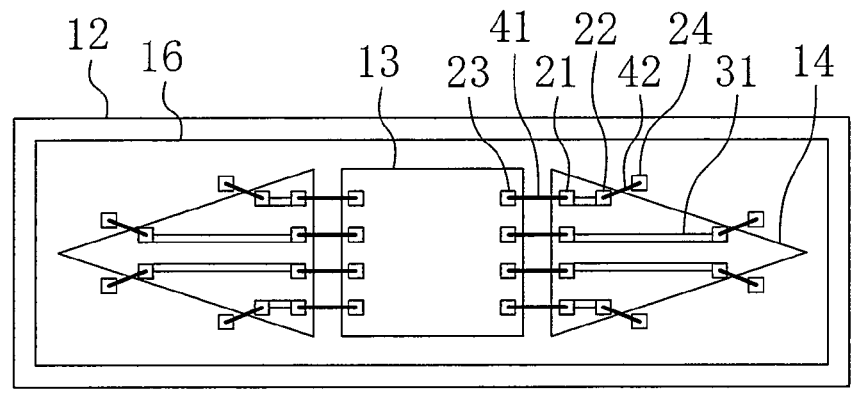
FIG. 2 is a plan view illustrating a modified example of the embodiment.
Figure 3:
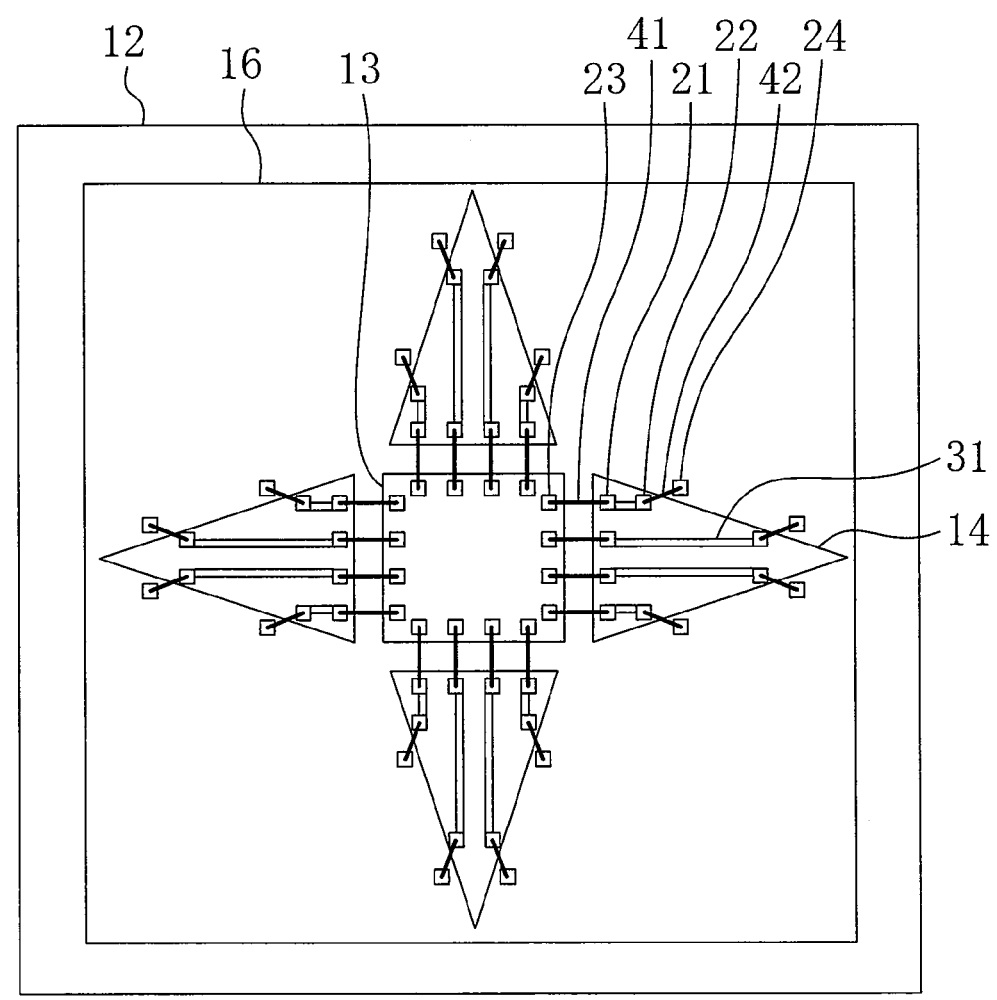
FIG. 3 is a plan view illustrating a modified example of the embodiment.

As illustrated in FIGS. 2 and 3, depending on the number and arrangement of the element electrodes 23 formed on the semiconductor element 13, a plurality of interposer elements 14 may be provided to face the respective sides of the semiconductor element 13.

Figure 4:
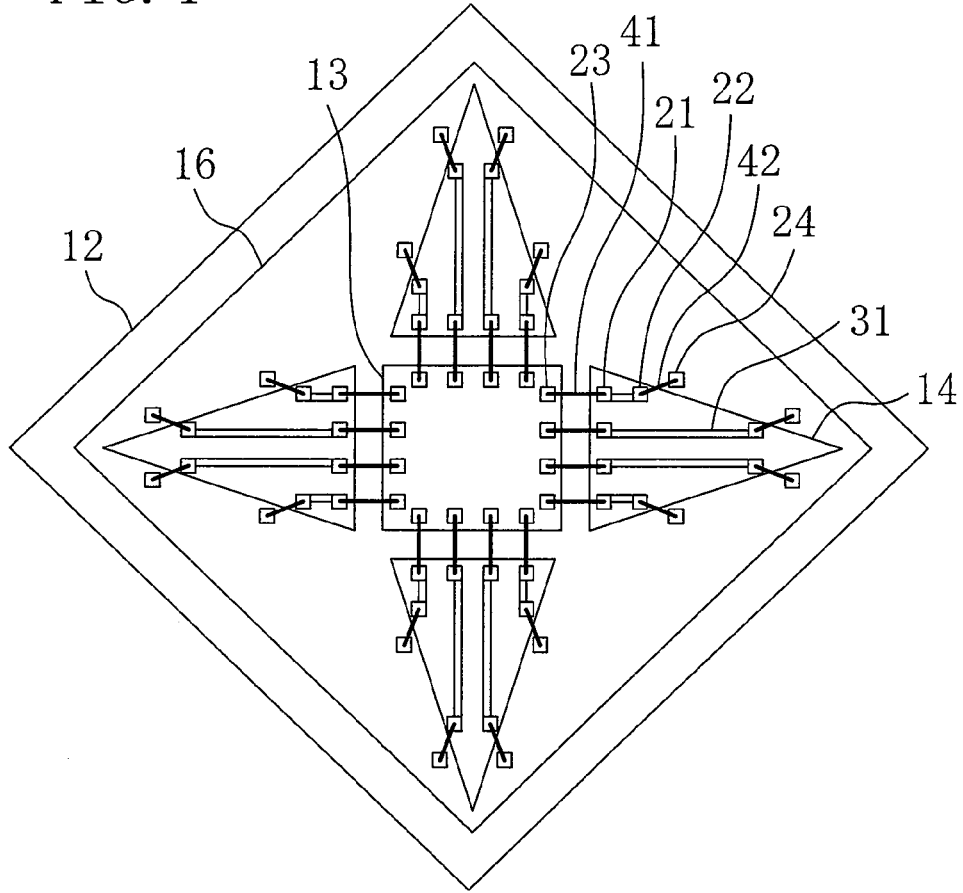
FIG. 4 is a plan view illustrating a modified example of the embodiment.

In the case of providing a plurality of interposer elements 14, the semiconductor element 13 may be tilted relative to the circuit board 12, as illustrated in FIG. 4. Then, efficient use of space can be achieved. When the semiconductor element 13 is a square in plan view, the semiconductor element 13 is placed such that each side of the semiconductor element 13 is at an angle of 45° with respect to the associated side of the circuit board 12 in order to obtain the most efficient arrangement.

Figure 5:
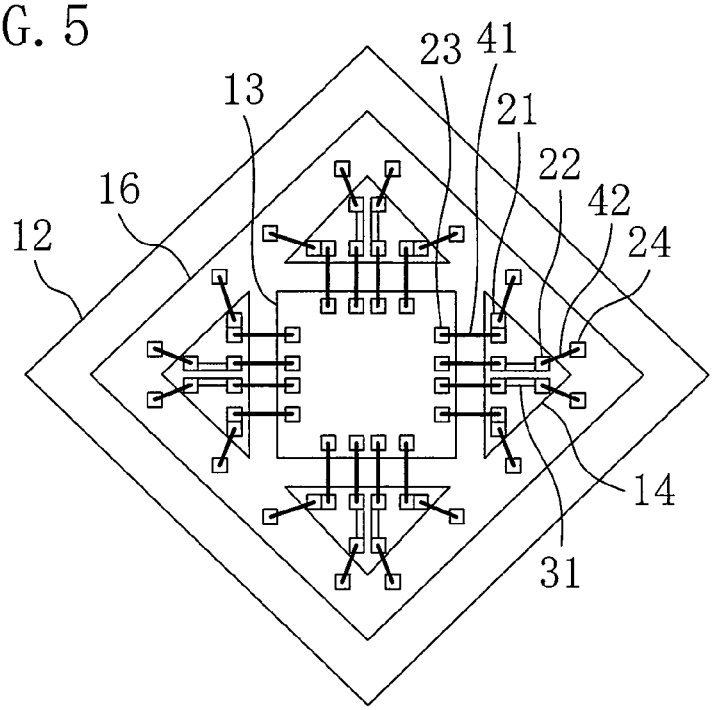
FIG. 5 is a plan view illustrating a modified example of the embodiment.

In this case, the interposer elements 14 may be isosceles right triangles as illustrated in FIG. 5. Then, the arrangement becomes more efficient.

Figure 6:
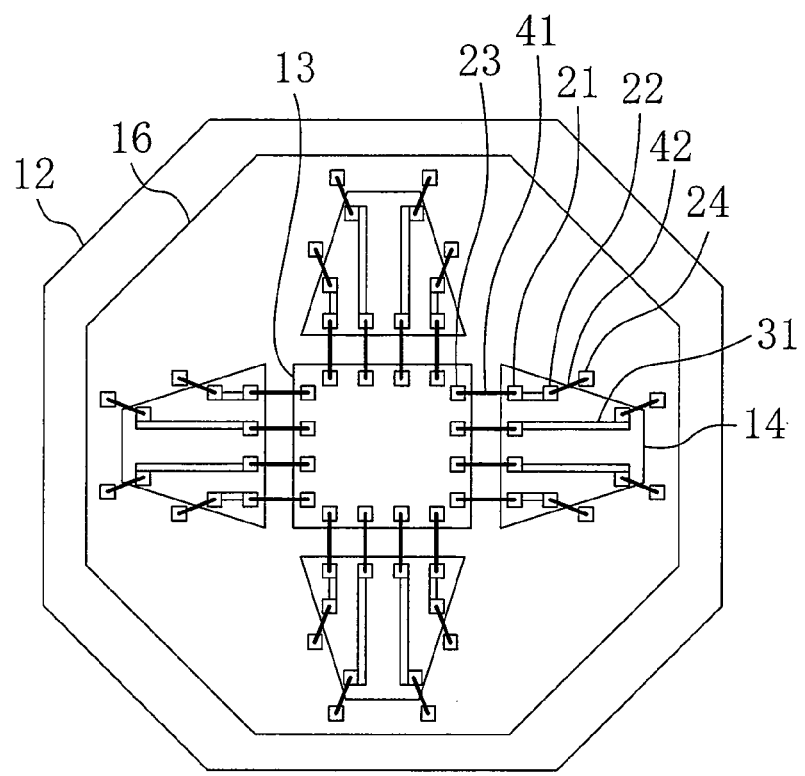
FIG. 6 is a plan view illustrating a modified example of the embodiment.

The interposer elements 14 may be trapezoids as illustrated in FIG. 6 in such a manner that the bottom bases of the interposer elements 14 respectively face the sides of the semiconductor element 13. In this case, when the circuit board 12 and the molding resin 16 are octagons in plan view, unnecessary space on the circuit board 12 is reduced.

Figure 7:
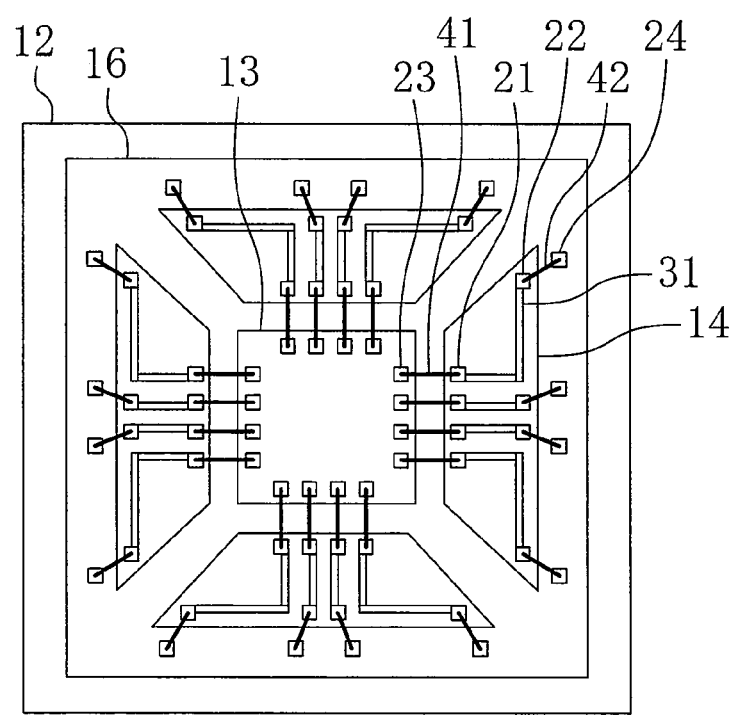
FIG. 7 is a plan view illustrating a modified example of the embodiment.

As illustrated in FIG. 7, the interposer elements 14 may be isosceles trapezoids in such a manner that the upper bases of the trapezoids respectively face the sides of the semiconductor element 13. Then, the interposer elements 14 can be efficiently arranged without the necessity of tilting the semiconductor element 13. In each of the interposer elements 14 in this case, the base angle is preferably 45°. In this case, the molding resin 16 is preferably injected from a corner of a portion to be molded. Then, the resin flows smoothly.

Figure 8:
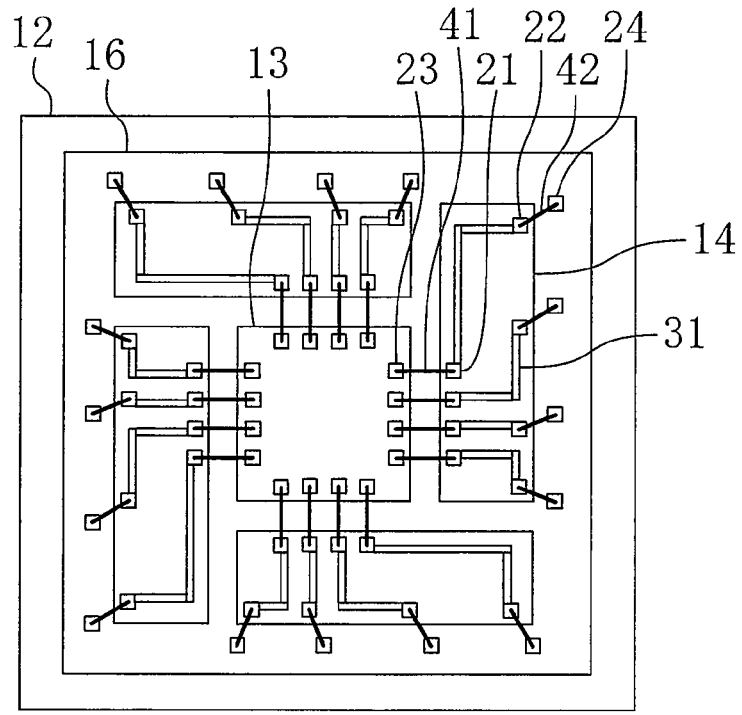
FIG. 8 is a plan view illustrating a modified example of the embodiment.
Figure 9:
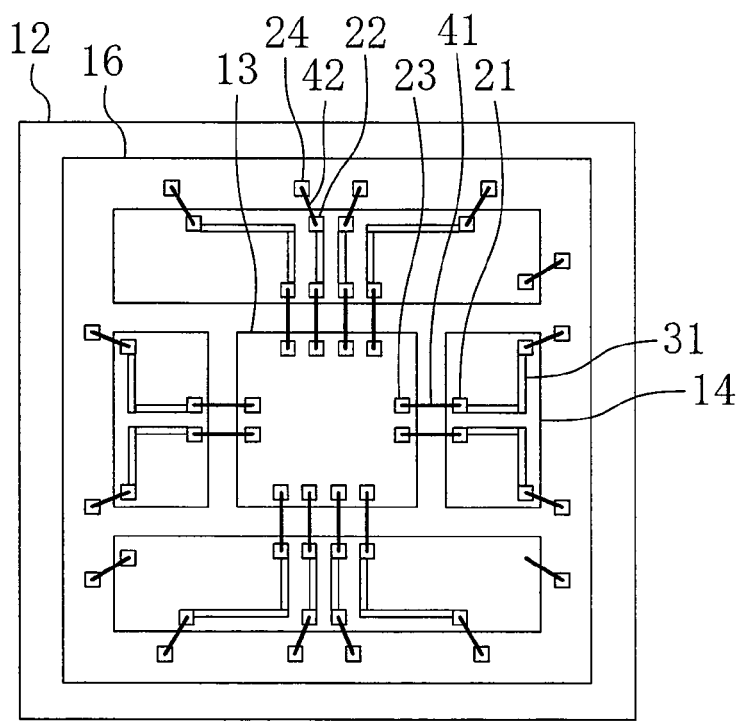
FIG. 9 is a plan view illustrating a modified example of the embodiment.

As illustrated in FIG. 8, the interposer elements 14 may be quadrilaterals such as squares or rectangles in plan view. Further, as illustrated in FIG. 9, as the interposer elements 14, different quadrilaterals may be arranged in combination.

Figure 10:
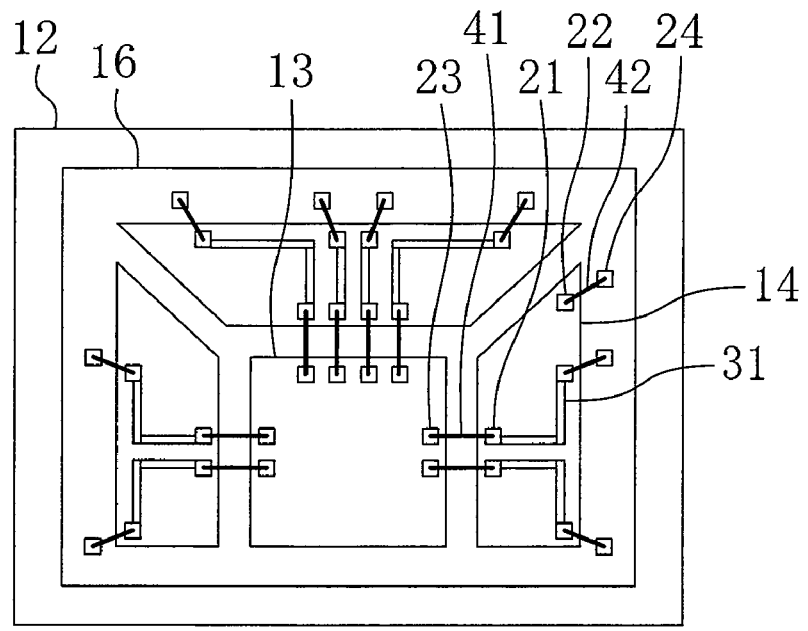
FIG. 10 is a plan view illustrating a modified example of the embodiment.
Figure 11:
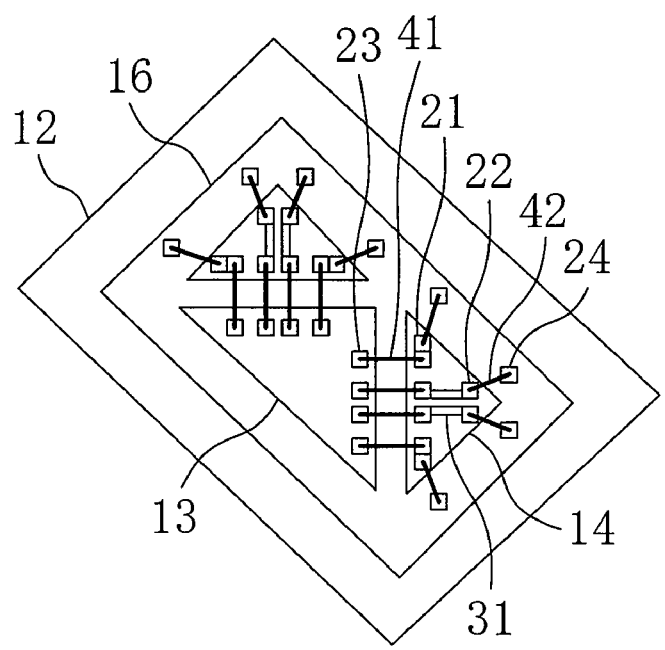
FIG. 11 is a plan view illustrating a modified example of the embodiment.

When the side of each of the interposer elements 14 opposite to the side thereof facing the semiconductor element 13 overlaps the outer periphery of a quadrilateral region, unnecessary space on the circuit board 12 is reduced, and thus efficient arrangement can be obtained, irrespective of the shape of the interposer elements 14. In this case, as illustrated in FIG. 10, the interposer elements 14 do not need to be provided to face all the sides of the semiconductor element 13. Further, as illustrated in FIG. 11, efficient arrangement can also be obtained even when the semiconductor element 13 is not a quadrilateral.

Figure 12A:
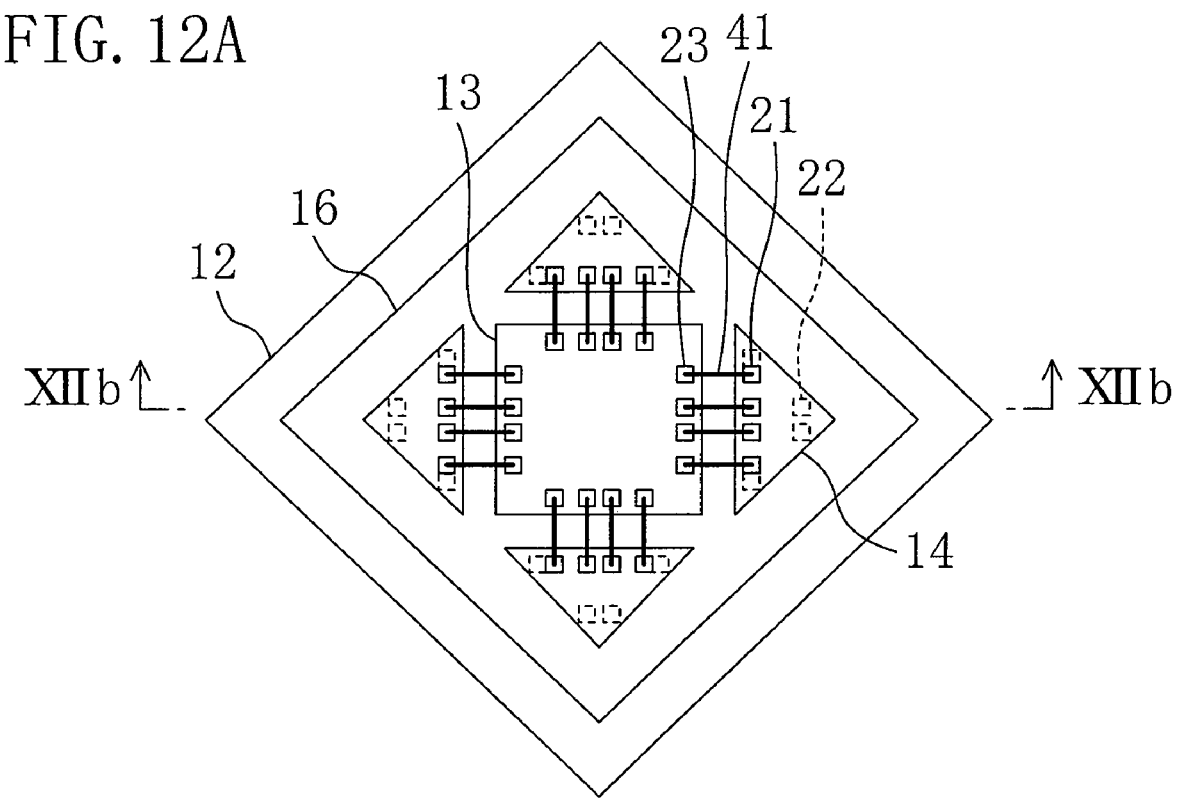
FIGS. 12A and 12B illustrate a modified example of the semiconductor device of the embodiment.
Figure 12B:
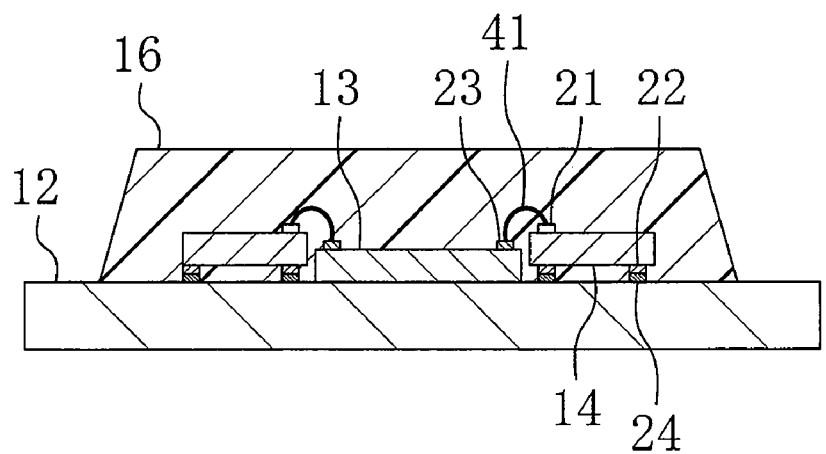

The connection between the second interposer electrodes 22 and the board electrodes 24 is not necessarily established by wire bonding. For example, as illustrated in FIG. 12, the second interposer electrodes 22 may be formed on the lower surfaces of the interposer elements 14 such that the second interposer electrodes 22 are connected to the board electrodes 24 by flip-chip bonding. Then, the flexibility in arranging the second interposer electrodes 22 on the interposer elements 14 increases, thus further reducing the sizes of the interposer elements 14. In addition, the sizes of the semiconductor element 13 and the circuit board 12 can also be reduced. As well as the flip-chip bonding, various techniques such as tape automated bonding and ball grid array bonding may be employed.

Figure 13:
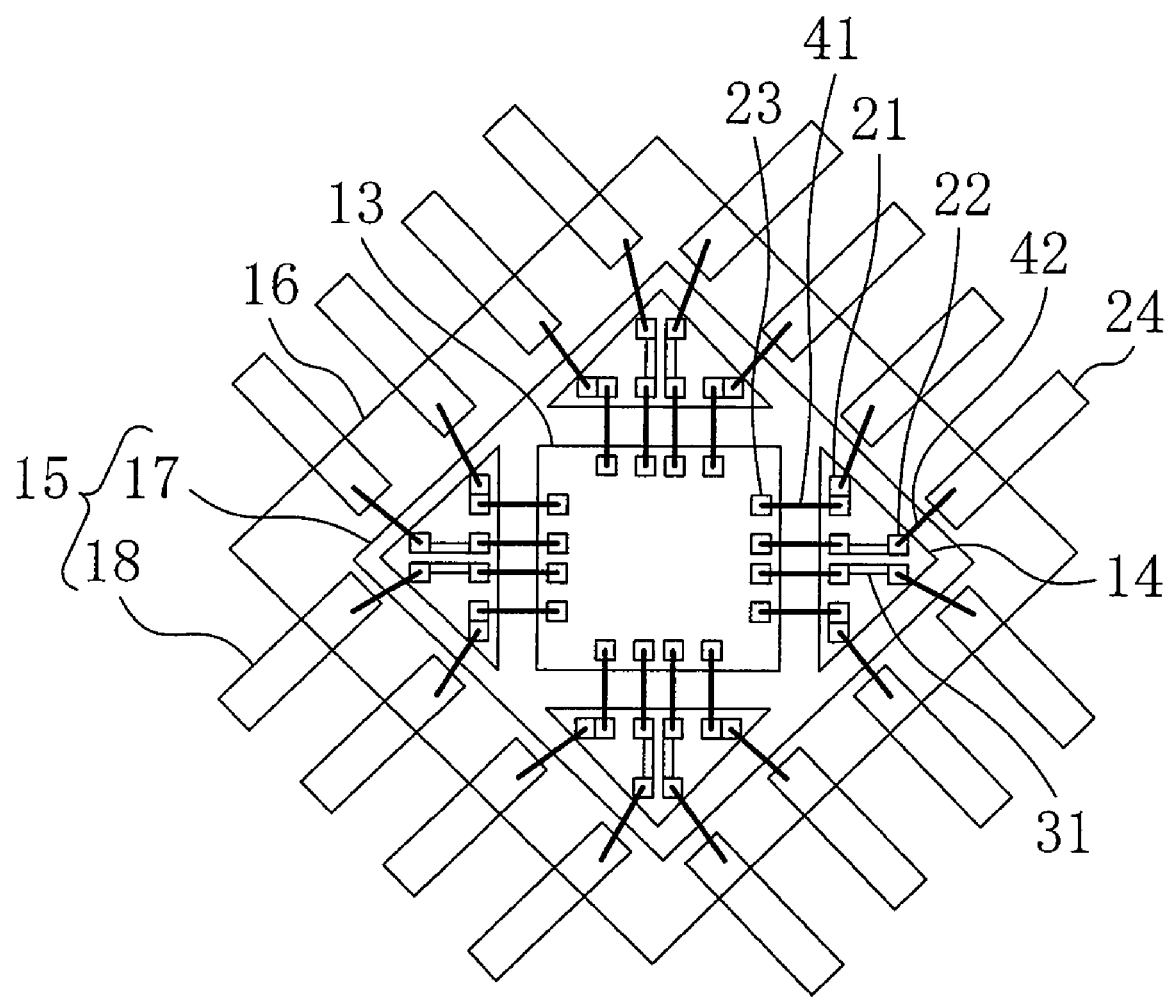
FIG. 13 is a plan view illustrating a modified example of the semiconductor device of the embodiment.

In this embodiment, the element mounting member for mounting the semiconductor element 13 thereon is the circuit board 12. Alternatively, as illustrated in FIG. 13, the element mounting member may be a lead frame 15 including die pads 17 and leads 18. In this case, the semiconductor device can be fabricated using materials at lower cost.

Figure 14:
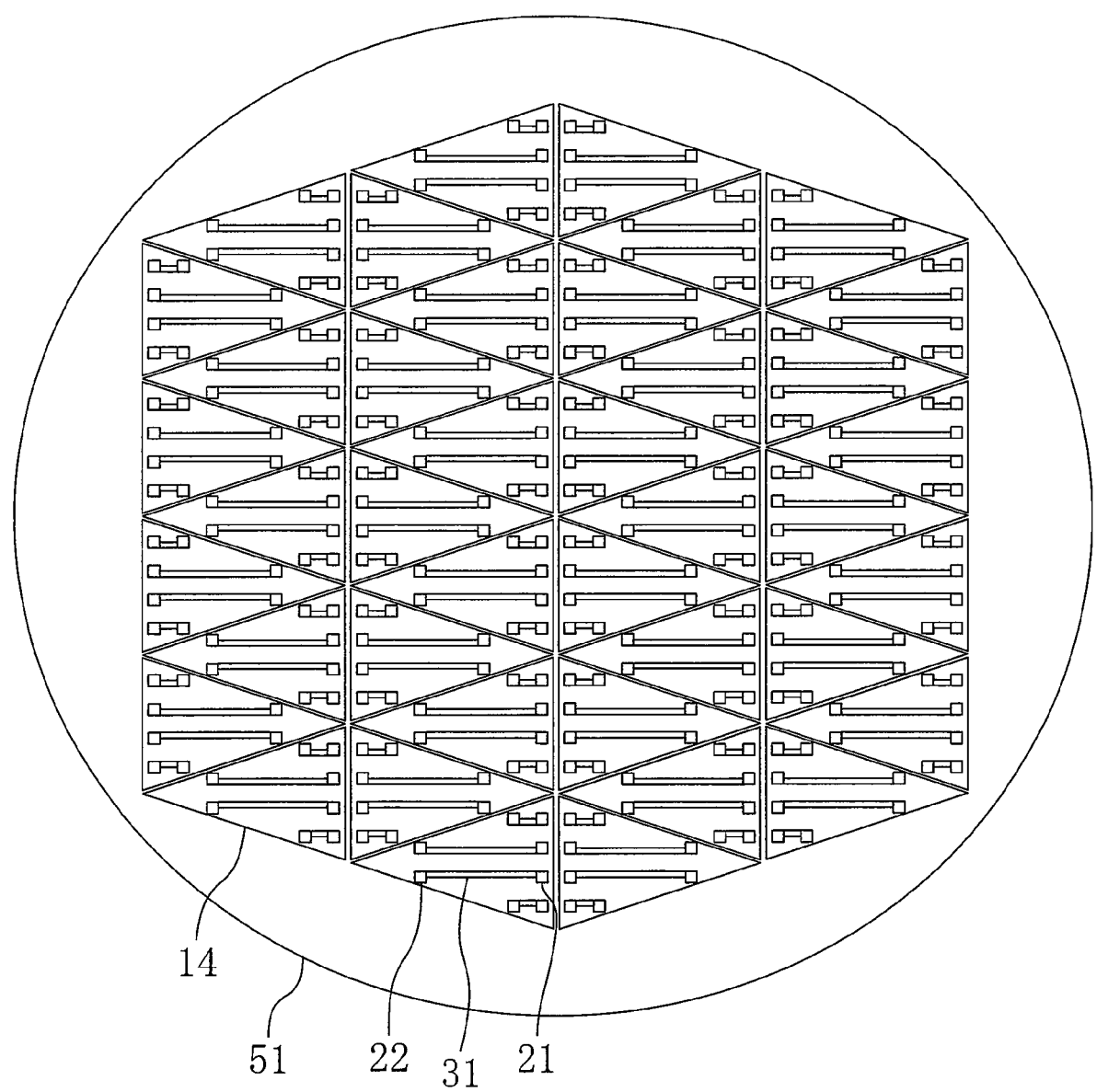
FIG. 14 is a plan view illustrating an example of a wafer on which interposer elements for use in the semiconductor device of the embodiment are formed.
Figure 15:
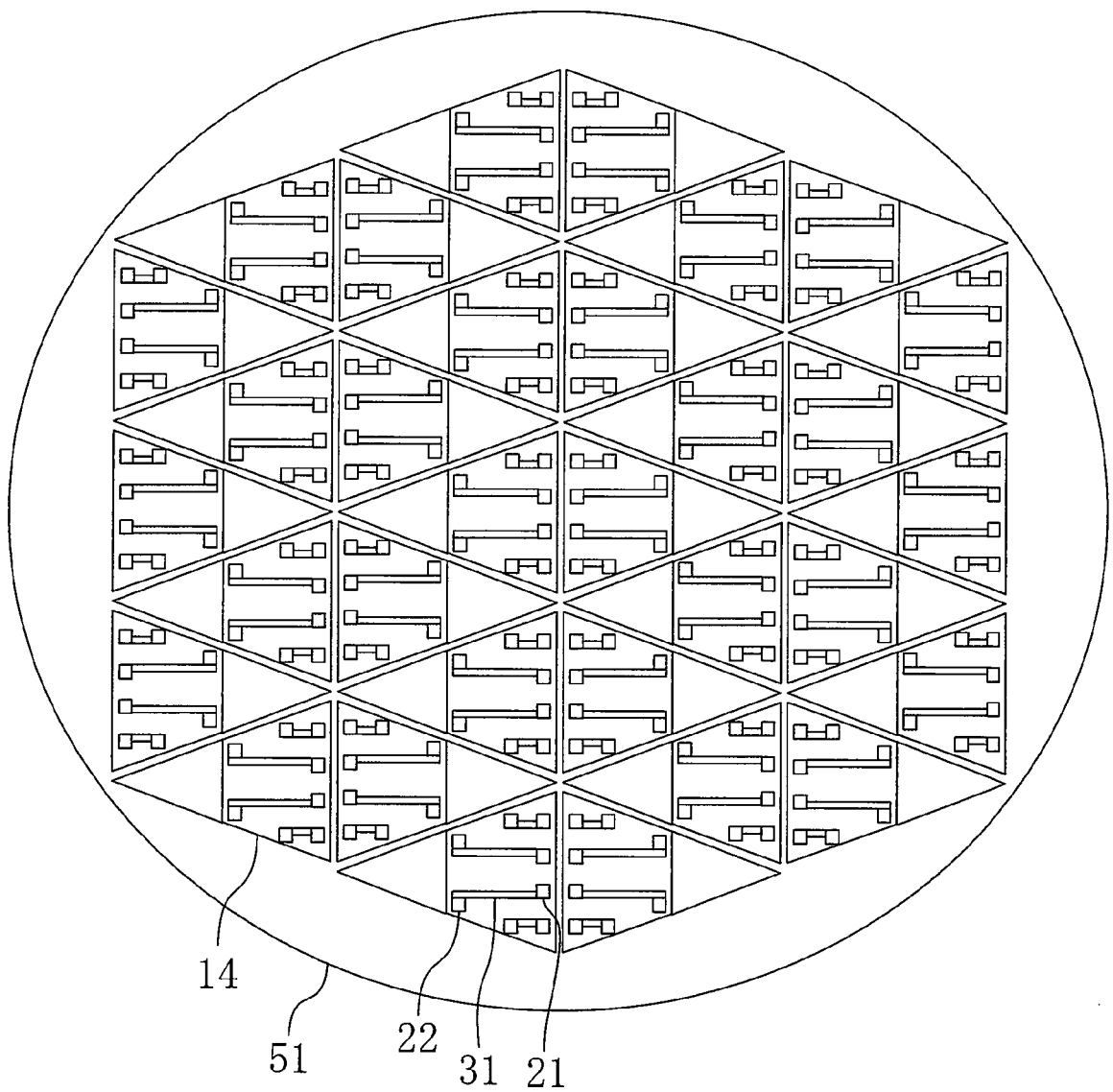
FIG. 15 is a plan view illustrating an example of a wafer on which interposer elements for use in the semiconductor device of the embodiment are formed.

It is sufficient that the interposer elements 14 are formed at a time on a wafer and then are separated by cutting the wafer. In a case where the interposer elements 14 are quadrilaterals in plan view, it is sufficient that the wafer is cut by dicing in the same manner as for usual semiconductor chips. When the interposer elements 14 are triangles in plan view, formation of a combination of interposer elements 14 on a wafer 51 as illustrated in FIG. 14 allows the three directions along the respective sides of the triangles to cross each other, thereby avoiding an increase in the number of cutting lines, as compared to usual wafer processing. When the interposer elements 14 are trapezoids in plan view, unused portions arise as a result of cutting the wafer to decrease the efficiency in using the wafer. To prevent this, arrangement as illustrated in FIG. 15 may be employed.

In view of size reduction of the semiconductor device, spacing may not be provided between the semiconductor element 13 and each of the interposer elements 14 and between the interposer elements 14. In such an arrangement, however, when wires are densely arranged, the gap between the wires might not be filled with resin. To prevent this, spacing is needed between the semiconductor element 13 and each of the interposer elements 14 and between the interposer elements 14. This spacing is preferably large in order to allow molding resin to flow and to achieve accurate die bonding or suppression of wire sweep, but is preferably small in order to achieve size reduction of the semiconductor device. Therefore, in consideration of displacement tolerance in die bonding and the aspect ratio between the chip thickness and spacing, spacing between the semiconductor element 13 and each of the interposer element 14 and between the interposer elements 14 preferably has enough widths and depths to allow the gap to be filled with resin, and are preferably small enough to prevent wire deformation. Specifically, the spacing is in the range from about 50 μm to about 4000 μm. For molding, a gate is preferably provided near the boundary between the semiconductor element 13 and the interposer elements 14. Then, resin smoothly flows in a boundary region.

Figure 16:
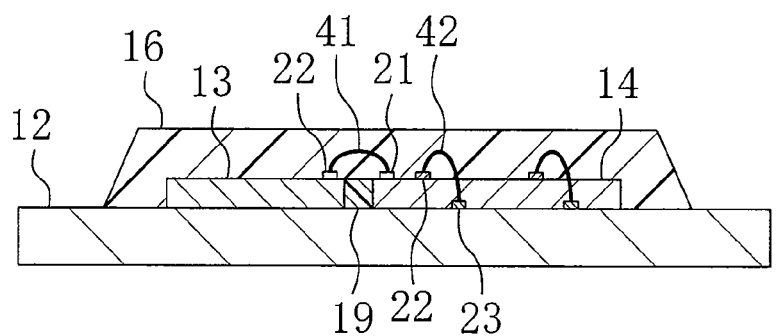
FIG. 16 is a cross-sectional view illustrating a modified example of the semiconductor device of the embodiment.

As illustrated in FIG. 16, in addition to the molding resin 16, an insulating resin layer 19 may be formed to fill gaps between the semiconductor element 13 and each of the interposer elements 14 and between the interposer elements 14. The method for forming the insulating resin layer 19 is not specifically limited. For example, the insulating resin layer 19 may be formed in such a manner that the semiconductor element 13 and the interposer elements 14 are mounted on the circuit board 12, then uncured insulating resin is provided between the semiconductor element 13 and the interposer elements 14 by printing or coating, and then the insulating resin is cured. Alternatively, the insulating resin layer 19 may be formed in such a manner that insulating resin is provided on a given region of the circuit board 12 beforehand, then the semiconductor element 13 and the interposer elements 14 are mounted on the circuit board 12, and then the insulating resin is cured.

The insulating resin layer 19 may also be formed between the semiconductor element 13 and the interposer elements 14 in such a manner that either the semiconductor element 13 or the interposer elements 14 are mounted on the circuit board 12, then insulating resin is provided, and then the other of the semiconductor element 13 and the interposer elements 14 are mounted on the circuit board 12. Alternatively, the insulating resin layer 19 may be formed in such a manner that insulating resin is provided on at least either the semiconductor element 13 or the interposer elements 14 beforehand, and then the semiconductor element 13 and the interposer elements 14 are mounted on the circuit board 12. In this case, the semiconductor element 13 and the interposer elements 14 may be united with insulating resin and then mounted on the circuit board 12 in order to form the insulating resin layer 19 between the semiconductor element 13 and the interposer elements 14. Instead of forming the insulating resin layer 19 by providing uncured insulating resin by printing or the like, an insulating resin film may be used.

In this manner, formation of the insulating resin layer 19 between the semiconductor element 13 and the interposer elements 14 prevents electrical contact between the semiconductor element 13 and the interposer elements 14 even when the semiconductor element 13 and each of the interposer elements 14 are close to each other on the circuit board 12, thus effectively downsizing the device and increasing the reliability thereof. The insulating resin layer 19 may be formed after wire bonding. Formation of the insulating resin layer 19 before wire bonding can suppress failures such as wire sweep, wire proximity, and wire sag caused by incomplete resin molding even in a case where wires are highly densely arranged.

The shapes of the interposer elements 14 described in this embodiment are only examples, and may be any shape. In the case of using a plurality of interposer elements 14, these interposer elements 14 may have different shapes and sizes. However, if the interposer elements 14 facing the respective sides of the semiconductor element 13 have substantially the same size, the internal configuration of the semiconductor device is simplified, thus easily designing the device. In addition, the symmetry as a whole device is enhanced, and thus the flow and distribution of the molding resin become uniform. Accordingly, formability in molding is improved, resulting in reduction of unnecessary space and suppression of distortion and warping of the wafer.

The interposer elements 14 may be mounted beforehand. Then, the assembly process can be simplified, and/or the semiconductor element mounting region can be clarified.

Not only the electrodes and the internal interconnections but also various passive components, sensors, or other elements having a variety of functions may be provided on the interposer elements 14. This can achieve the functions of the present disclosure more effectively.

Modified Examples and Embodiment

Figure 17:
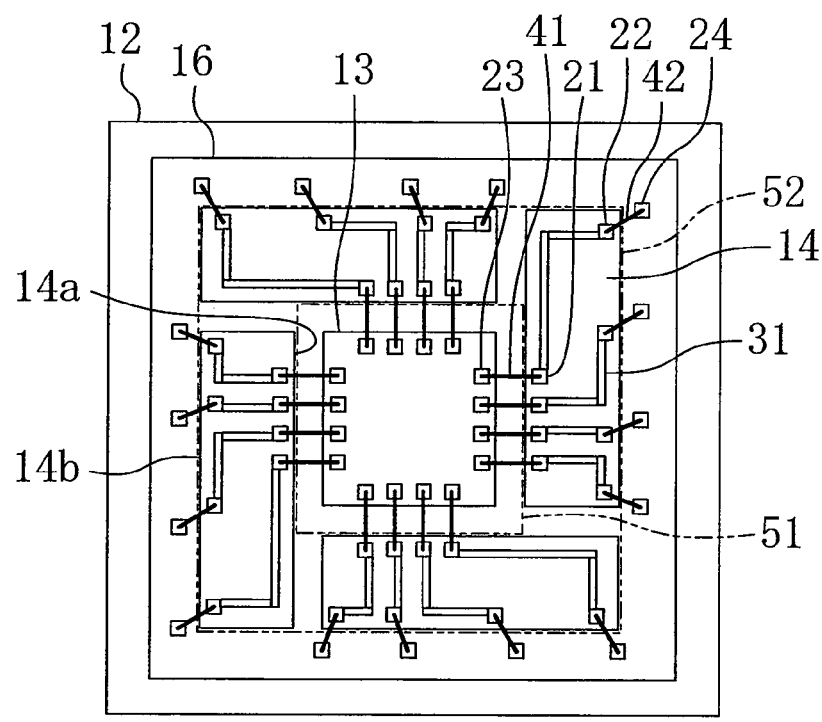
FIG. 17 is a cross-sectional view illustrating a semiconductor device according to a modified example of the embodiment.

Now, modified examples of the embodiment of the present invention are described with reference to the drawings. As described above, FIGS. 8 and 9 illustrate examples in which a plurality of interposer elements 14 each in the shape of a quadrilateral in plan view are arranged. In the modified examples, the interposer elements 14 can be more effectively arranged in the following manner:

FIG. 17 is a plan view illustrating a semiconductor device according to a modified example. As illustrated in FIG. 17, a first region 51 which is a quadrilateral in plan view and a second region 52 larger than the first region 51 are provided on a circuit board 12 as an element mounting member. A semiconductor element 13 which is a quadrilateral in plan view is located on the first region 51. Interposer elements 14 are located on the second region 52 such that a first side 14a of each of the interposer elements 14 overlaps a side of the quadrilateral of the first area 51 and that a second side 14b of each of the interposer elements 14 opposite to the first side 14a overlaps a side of the quadrilateral of the second region 52. Each of the four corners of the second region 52 coincides with a corner of one of the interposer elements 14. In other words, the first region 51 is enclosed with a line formed by extending the first sides 14a of the respective interposer elements 14 and linking these extended first sides 14a together, and the second region 52 is enclosed with a line formed by extending the second sides 14b of the respective interposer elements 14 and linking the extended second sides 14b together. Such an arrangement allows the interposer elements 14 to be arranged around the semiconductor element 13 without wasting space, resulting in reduction of the product size.

In this case, on each of the interposer elements 14, first interposer electrodes 21 are provided closer to the first side 14a than second interposer electrodes 22, and the second interposer electrodes 22 are provided closer to the second side 14b than the first interposer electrodes 21. That is, the first interposer electrodes 21 are arranged along the first side 14a overlapping a side of the quadrilateral of the first region 51, and the second interposer electrodes 22 are arranged along one of the other sides of the interposer element 14 overlapping a side of the quadrilateral of the second region 52. When the first interposer electrodes 21 and the second interposer electrodes 22 are arranged in this manner, element electrodes 23 of the semiconductor element 13 mounted on the first region 51 can be effectively connected to board electrodes 24 provided outside the second region 52.

Figure 18:
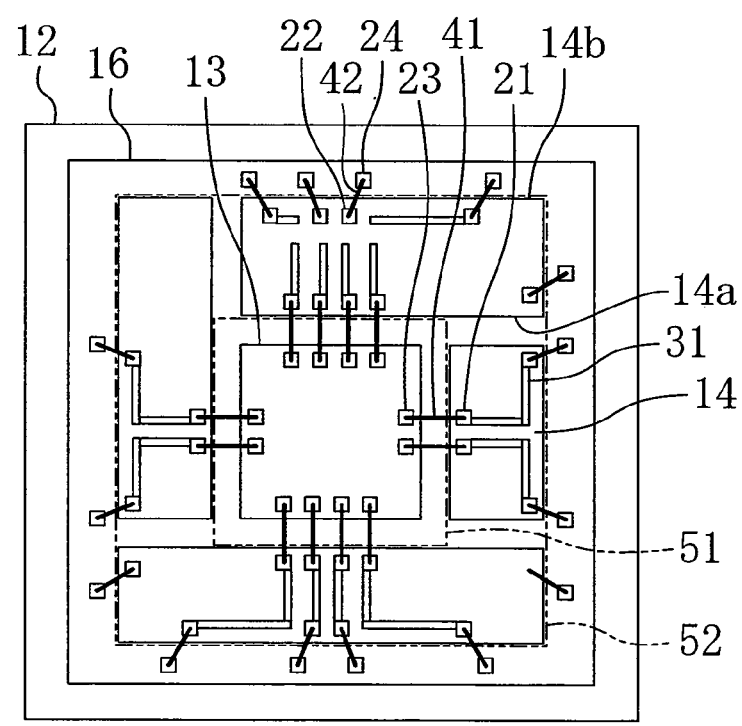
FIG. 18 is a cross-sectional view illustrating a semiconductor device according to a modified example of the embodiment.

In the example illustrated in FIG. 17, the interposer elements 14 have an identical size. In this example, the interposer elements 14 are easily formed, and are arranged on a wafer with a small space wasted, resulting in cost reduction. Alternatively, interposer elements 14 having different sizes may be used in combination. Even in this case, effective arrangement of the interposer elements 14 can also be achieved when the first sides 14a of the respective interposer elements 14 have an identical length. Alternatively, an arrangement as illustrated in FIG. 18 may be employed. In this case, effective arrangement can also be obtained even when interposer elements 14 having different sizes are used in combination.

The center of the first region 51 may coincide with the center of the second region 52. Then, symmetry as a whole device is enhanced, thus facilitating circuit design. In addition, resin which has been injected during resin molding flows uniformly, and warping of the circuit board 12 is less likely to occur.

To obtain a uniform flow of resin, the interposer elements 14 are preferably equally spaced from the semiconductor element 13.

Figure 19:
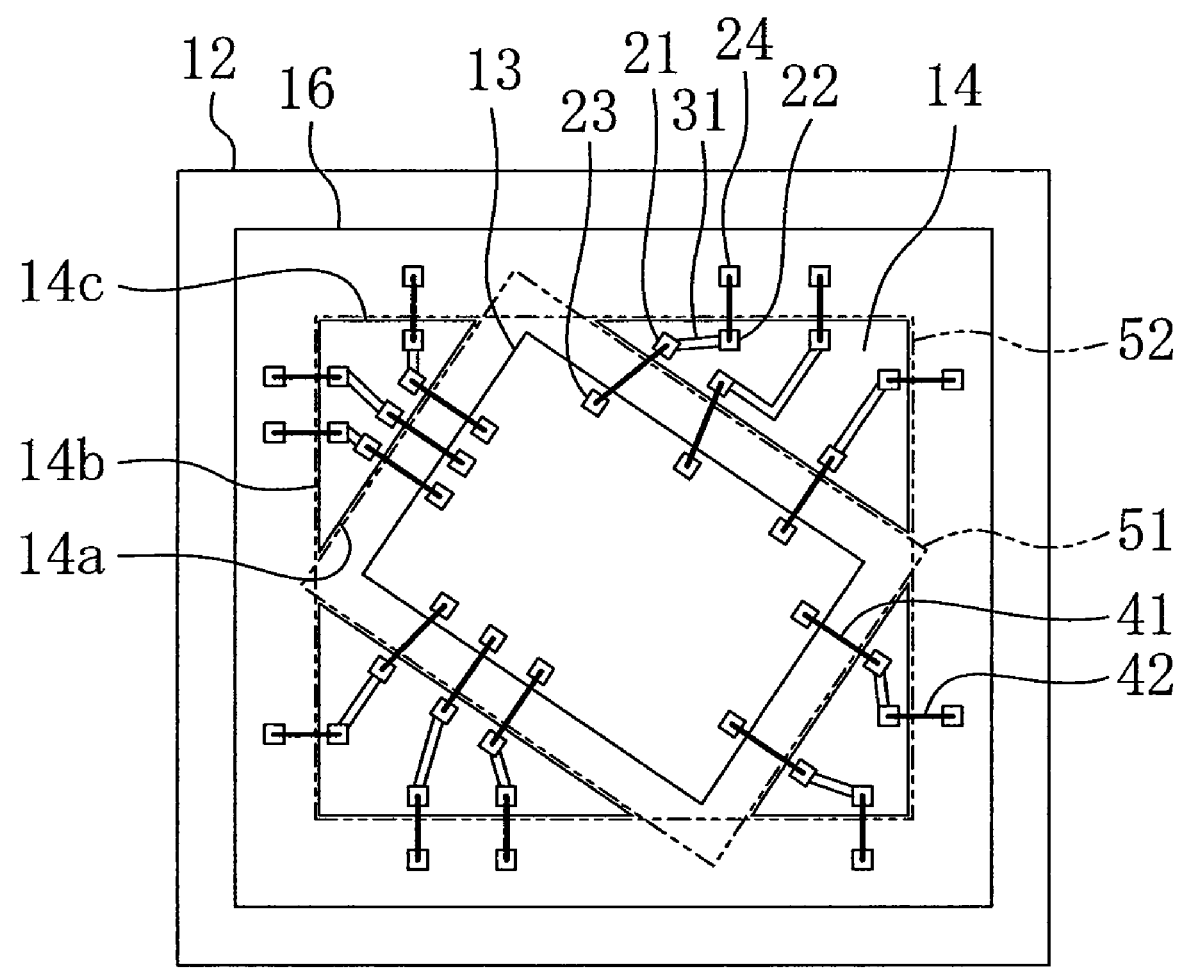
FIG. 19 is a cross-sectional view illustrating a semiconductor device according to a modified example of the embodiment.

In the examples illustrated in FIGS. 17 and 18, one of the sides of the first region 51 extends in the same direction as one of the sides of the second region 52. Alternatively, as illustrated in FIG. 19, one of the sides of the first region 51 may extend in a direction different from any of the sides of the second region 52. In this case, it is sufficient that the interposer elements 14 are not quadrilaterals but triangles in plan view. In this arrangement, a second side 14b and a third side 14c, except for the first side 14a, of each of the interposer elements 14 overlap different sides of the second region 52. The vertexes of the first region 51 are preferably located outside the second region 52. Then, even when one of the sides of the first region 51 extends in a direction different from any of the sides of the second region 52, the mounting area can be minimized.

As described above, this disclosure provides a semiconductor device on which a fine-pitch semiconductor element is mounted without a technique of stacking the semiconductor element, and thus is useful for a fine-pith multi-terminal semiconductor device and a method for fabricating such a device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device, comprising:
    an element mounting member including a first electrode;
    a semiconductor element mounted on the element mounting member and including a second electrode; and
    an interposer element mounted on the element mounting member with a first side of the interposer element facing a side of the semiconductor element, the interposer element being one of a triangle and a trapezoid in plan view and including
        a first interposer electrode electrically connected to the second electrode via a first wire,
        a second interposer electrode electrically connected to the first electrode, and
        an internal interconnection electrically connecting the first interposer electrode and the second interposer electrode to each other.

2. The semiconductor device of claim 1, wherein each of the semiconductor element and the element mounting member is a quadrilateral in plan view, and
    the semiconductor element has a side extending in a direction different from any of the sides of the element mounting member.

3. The semiconductor device of claim 1, wherein the semiconductor element and the interposer element are spaced apart from each other.

4. The semiconductor device of claim 3, wherein a distance between the semiconductor element and the interposer element is in the range from 50 μm to 4000 μm, both inclusive.

5. The semiconductor device of claim 3, further comprising an insulating resin layer formed between the semiconductor element and the interposer element.

* * * * *